(12) United States Patent
Takamine

(10) Patent No.: US 10,601,570 B2
(45) Date of Patent: Mar. 24, 2020

(54) MULTIPLEXER, RADIO-FREQUENCY FRONT-END CIRCUIT, AND COMMUNICATION APPARATUS

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/228,974

(22) Filed: Dec. 21, 2018

(65) Prior Publication Data

US 2019/0149312 A1    May 16, 2019

Related U.S. Application Data

(63) Continuation of application No. PCT/JP2017/017560, filed on May 9, 2017.

(30) Foreign Application Priority Data

Jun. 29, 2016  (JP) ................................. 2016-129436

(51) Int. Cl.
*H04L 5/14* (2006.01)
*H04B 1/52* (2015.01)
(Continued)

(52) U.S. Cl.
CPC ........... *H04L 5/14* (2013.01); *H03H 9/02574* (2013.01); *H03H 9/14541* (2013.01);
(Continued)

(58) Field of Classification Search
CPC .......... H04L 5/14; H04L 25/00; H03H 9/706; H03H 9/6436; H03H 9/02574;
(Continued)

(56) References Cited

U.S. PATENT DOCUMENTS

| 5,831,493 A | 11/1998 | Ushiroku |
| 6,326,864 B1 | 12/2001 | Takamine et al. |

(Continued)

FOREIGN PATENT DOCUMENTS

| JP | 05-076122 U | 10/1993 |
| JP | 07-131291 A | 5/1995 |

(Continued)

OTHER PUBLICATIONS

Official Communication issued in International Patent Application No. PCT/JP2017/017560, dated Jul. 25, 2017.

(Continued)

*Primary Examiner* — Thai Nguyen
(74) *Attorney, Agent, or Firm* — Keating & Bennett, LLP

(57) ABSTRACT

A quadplexer includes a filter of a first duplexer that has a passband with frequencies lower than a filter of a second duplexer. A series resonator closest to a common terminal of the filter includes split resonators that are each an elastic wave resonator including an IDT electrode and a reflector, and include first and second split resonators with impedance characteristics having ripples different from each other in a certain frequency range higher than an anti-resonant frequency of the series resonator closest to the common terminal, that is defined by a pitch of electrode fingers included in the reflector, and that is included in a passband of the filter.

20 Claims, 7 Drawing Sheets

(51) Int. Cl.
  H03H 9/64    (2006.01)
  H03H 9/72    (2006.01)
  H03H 9/145   (2006.01)
  H04B 1/00    (2006.01)
  H04L 25/00   (2006.01)
  H03H 9/02    (2006.01)
  H03H 9/70    (2006.01)
  H04B 1/40    (2015.01)

(52) U.S. Cl.
  CPC ........ *H03H 9/6436* (2013.01); *H03H 9/6483* (2013.01); *H03H 9/706* (2013.01); *H03H 9/725* (2013.01); *H04B 1/00* (2013.01); *H04B 1/0057* (2013.01); *H04B 1/40* (2013.01); *H04B 1/52* (2013.01); *H04L 25/00* (2013.01)

(58) Field of Classification Search
  CPC .. H03H 9/14541; H03H 9/725; H03H 9/6483; H03H 9/72; H03H 9/64; H03H 9/145; H04B 1/0057; H04B 1/00; H04B 1/52; H04B 1/40
  See application file for complete search history.

(56) References Cited

U.S. PATENT DOCUMENTS

| | | | |
|---|---|---|---|
| 2013/0154763 A1 | 6/2013 | Takamine | |
| 2016/0261249 A1 | 9/2016 | Takamine | |
| 2017/0201234 A1* | 7/2017 | Jager | .................. H03H 9/02015 |
| 2017/0331457 A1* | 11/2017 | Satoh | .................... H01L 41/107 |

FOREIGN PATENT DOCUMENTS

| | | |
|---|---|---|
| JP | 09-55640 A | 2/1997 |
| JP | 2000-261288 A | 9/2000 |
| JP | 2001-308676 A | 11/2001 |
| JP | 2003-032080 A | 1/2003 |
| JP | 2005-191797 A | 7/2005 |
| JP | 2012-028896 A | 2/2012 |
| WO | 2012/032832 A1 | 3/2012 |
| WO | 2015/080045 A1 | 6/2015 |

OTHER PUBLICATIONS

Qorvo, "White Paper: Addressing Carrier Aggregation Challenges Using Multiplexer Solutions", https://www.qorvo.com/resources/d/qorvo-addressing-carrier-aggregation-challenges-using-multiplexer-solutions-white-paper-january-2016, Jan. 2016, pp. 3-6.

Official Communication issued in Japanese Patent Application No. 2018-524934, dated Nov. 26, 2019.

\* cited by examiner

MULTIPLEXER, RADIO-FREQUENCY FRONT-END CIRCUIT, AND COMMUNICATION APPARATUS

CROSS REFERENCE TO RELATED APPLICATIONS

This application claims the benefit of priority to Japanese Patent Application No. 2016-129436 filed on Jun. 29, 2016 and is a Continuation Application of PCT Application No. PCT/JP2017/017560 filed on May 9, 2017. The entire contents of each application are hereby incorporated herein by reference.

BACKGROUND OF THE INVENTION

1. Field of the Invention

The present invention relates to a multiplexer, a radio-frequency front-end circuit, and a communication apparatus.

2. Description of the Related Art

In recent years, a demultiplexer for isolating (demultiplexing) a radio-frequency (RF) signal in units of frequency bands in order to cope with a plurality of frequency bands and a plurality of wireless systems, namely, multi-bands and multi-modes, using one terminal has been widely used in communication apparatuses, such as cellular phone terminals. As such a demultiplexer, a quadplexer configured by combining two duplexers, each including a transmission filter and a reception filter, has been proposed (for example, see Japanese Unexamined Patent Application Publication No. 2012-028896).

In a multiplexer, such as a quadplexer configured as described above, because paths going through the individual filters are connected to each other, one filter's characteristics may affect another filter's characteristics. Therefore, one filter's characteristics that do not cause problems in that filter may deteriorate another filter's characteristics. Specifically, one filter's stopband ripples (ripples generated in that filter's stopband) do not affect characteristics in that filter's passband. However, in the case in which a frequency at which the stopband ripples are generated is located in another filter's passband, this may increase ripples in the other filter's passband (passband ripples).

SUMMARY OF THE INVENTION

Preferred embodiments of the present invention provide multiplexers, RF front-end circuits, and communication apparatuses each capable of reducing or preventing ripples in a passband.

A multiplexer according to a preferred embodiment of the present invention includes a common terminal; a first terminal and a second terminal; a first duplexer disposed on a first path connecting the common terminal and the first terminal; and a second duplexer disposed on a second path connecting the common terminal and the second terminal. A first filter included in the first duplexer has a passband whose frequencies are lower than a passband of a second filter included in the second duplexer. The first filter includes one or more series resonators disposed on the first path, and one or more parallel resonators disposed on a path connecting the first path and ground. A series resonator closest to the common terminal among the one or more series resonators includes a plurality of split resonators connected in series without any of the one or more parallel resonators connected therebetween. The plurality of split resonators are each an elastic wave resonator including an IDT electrode and a reflector, and include first and second split resonators whose impedance characteristics include ripples that are different from each other in a certain frequency range. The certain frequency range is a frequency range that is higher than an anti-resonant frequency of the series resonator closest to the common terminal, that is defined by a pitch of a plurality of electrode fingers of the reflector, and that is included in a passband of the second filter.

Here, the impedance characteristics of each elastic wave resonator include ripples whose frequency and phase are defined by the pitch (electrode pitch) of a plurality of electrode fingers (hereinafter, reflection electrode fingers) of the reflector on a higher frequency side of the stopband of the reflector. Thus, in the case in which a series resonator that is closest to the common terminal in the first filter includes one SAW resonator, and ripples caused by the SAW resonator are located in the passband of the second filter, the effects of ripples of the series resonator of the first filter appear in the passband of the second filter. In contrast, according to the present preferred embodiment, because the series resonator includes first and second split resonators whose impedance characteristics include ripples that are different from each other in the certain frequency range, the effects of the ripples of the first and second split resonators that appear in the passband of the second filter cancel each other out and thus are smoothed. Therefore, because ripples caused by the first filter are smoothed, ripples in the passband of the second filter are able to be reduced or prevented.

In addition, the plurality of split resonators may include three or more split resonators in which the ripples are different from each other.

Accordingly, ripples caused by the first filter are further smoothed, thus further reducing or preventing ripples in the passband of the second filter.

In addition, the first and second split resonators may include a different design parameter, such that the ripples are be different from each other.

Because ripples are different from each other by making the design parameters different from each other as described above, a multiplexer capable of smoothing ripples caused by the first filter is able to be easily manufactured.

In addition, the first and second split resonators may include the different design parameters such that capacitances of the IDT electrodes are equal or approximately equal.

Accordingly, the magnitude of ripples of the impedance characteristics are equal or approximately equal in the first split and second split resonators. Therefore, ripples caused by the first filter are further smoothed, thus further reducing or preventing ripples in the passband of the second filter. In addition, because the capacitances of the IDT electrodes in the first and second split resonators are equal or approximately equal, the power durability performances of the first and second split resonators are equal or approximately equal to each other. Thus, the power durability performance of the entire series resonator including the plurality of split resonators is able to be improved.

In addition, the design parameter may be at least one of the pitch, a cross width, a number of pairs, and a duty of the plurality of electrode fingers included in the IDT electrode, and a distance between the IDT electrode and the reflector.

Accordingly, the magnitude, phase and frequency of ripples of the impedance characteristics, a frequency at which the ripples are generated, or other characteristics is different from each other in the first split and second split resonators. Therefore, ripples caused by the first filter are further smoothed, thus further reducing or preventing ripples in the passband of the second filter. In addition, the design parameters are able to be easily made different by making the width or length of the plurality of electrode fingers or the distance between the IDT electrode and the reflector different in a process of manufacturing the multiplexer.

In addition, the first and second split resonators may be structured such that the distance between the IDT electrode and the reflector is greater than or equal to about $0.44\lambda$ and less than about $0.5\lambda$ where $\lambda$ is the pitch of the plurality of electrode fingers included in the IDT electrode.

That is, the inventor of preferred embodiments of the present invention discovered that, as a result of extensive study, ripples in the passband are able to be reduced or prevented in the case in which the distance between the IDT electrode and the reflector is greater than or equal to about $0.44\lambda$ and less than about $0.5\lambda$. Specifically, if the distance between the IDT electrode and the reflector is too small, ripples in the passband of the first filter increase. Alternatively, if the distance between the IDT electrode and the reflector is too large, ripples in the passband of the second filter increase. Therefore, ripples in the passband are able to be reduced or prevented in both of the first and second filters by maintaining the distance between the IDT electrode and the reflector within an appropriate range.

In addition, the first filter may have a ladder filter structure that includes at least one stage including the one or more series resonators and the one or more parallel resonators.

Alternatively, the first filter may have a ladder filter structure including a plurality of stages.

Accordingly, the bandpass characteristics of the entire first filter are able to be finely adjusted.

In addition, the first filter may further include a longitudinally coupled filter structure disposed on the first path.

Accordingly, the multiplexer is able to adapt to required filter characteristics, such as improved attenuation.

In addition, the multiplexer may further include a piezoelectric film including a main surface on which the IDT electrode and the reflector are disposed; a high-acoustic-velocity supporting substrate in which an acoustic velocity of bulk waves propagating therethrough is higher than an acoustic velocity of elastic waves propagating through the piezoelectric film; and a low-acoustic-velocity film disposed between the high-acoustic-velocity supporting substrate and the piezoelectric film, in which an acoustic velocity of bulk waves propagating therethrough is lower than an acoustic velocity of bulk waves propagating through the piezoelectric film.

Accordingly, the Q factor of each resonator including the IDT electrode is able to be maintained at a high value.

In addition, the passband of the first filter may be an uplink frequency band of Band 3, and the passband of the second filter may be an uplink frequency band of Band 1.

In the case in which the passband of the first filter is an uplink frequency band of Band 3 and the passband of the second filter is an uplink frequency band of Band 1, ripples in the passband of the second filter tend to increase. Thus, this increase of ripples is able to be effectively reduced or prevented by configuring the series resonator closest to the common terminal of the first filter to satisfy the above-mentioned condition.

In addition, a radio-frequency front-end circuit according to a preferred embodiment of the present invention includes any of the above-described multiplexers, and an amplifier circuit connected to the multiplexer.

Accordingly, a radio-frequency front-end circuit capable of reducing or preventing ripples in a passband is provided.

In addition, a communication apparatus according to a preferred embodiment of the present invention includes an RF signal processing circuit that processes a radio frequency signal transmitted and received by an antenna element and the radio-frequency front-end circuit transferring the radio frequency signal between the antenna element and the RF signal processing circuit.

Accordingly, a communication apparatus capable of reducing or preventing ripples in a passband is provided.

According to preferred embodiments of the present invention, ripples in the passband are able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
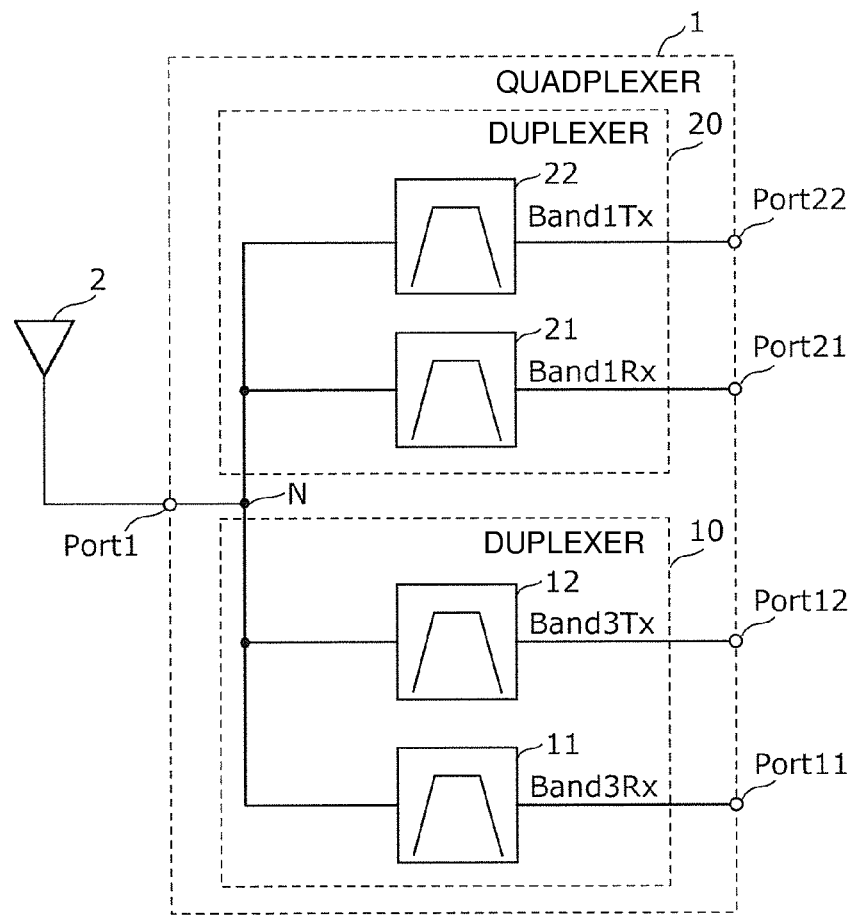
FIG. 1 is a configuration diagram of a quadplexer according to a first preferred embodiment of the present invention.

Hereinafter, preferred embodiments of the present invention will be described in detail with reference to the accompanying drawings. Note that the preferred embodiments described below illustrate comprehensive or specific examples. Numerals, shapes, materials, elements, and the arrangement and connection structure of the elements described in the following preferred embodiments are only exemplary and do not limit the present invention. Among the elements in the following preferred embodiments, elements that are not described in independent claims are described as arbitrary and/or optional elements. In addition, the sizes or size ratios of elements illustrated in the drawings are not necessarily precise. Further, the same or substantially the same configurations in the drawings are denoted by the same reference symbol, and overlapping descriptions may be omitted or simplified. In the following preferred embodiments, "connected" includes not only the case in which elements are directly connected to each other, but also the case in which elements are electrically coupled to each other with another element interposed therebetween.

First Preferred Embodiment

In a first present preferred embodiment of the present invention, a quadplexer will be described as an example of a multiplexer.

FIG. 1 is a configuration diagram of a quadplexer 1 according to the present preferred embodiment. Note that an antenna element 2, connected to a common terminal Port 1 of the quadplexer 1, is also illustrated in the diagram.

The quadplexer 1 includes a plurality of filters (here, for example, four filters 11, 12, 21, and 22) with different passbands, and antenna-side terminals of these filters are bundled at the common terminal Port 1. In other words, one of two terminals of each of these filters is connected to the common terminal Port 1.

In the present preferred embodiment, the quadplexer 1 preferably supports LTE (Long Term Evolution), for example, and allows RF signals in bands defined by 3GPP (Third Generation Partnership Project) to pass.

Specifically, as illustrated in FIG. 1, the quadplexer 1 includes the common terminal Port 1, four individual terminals Port 11, Port 12, Port 21, and Port 22, and the four filters 11, 12, 21, and 22.

The common terminal Port 1 is provided commonly for the four filters 11, 12, 21, and 22, and is connected to the filters 11, 12, 21, and 22 inside the quadplexer 1. In addition, the common terminal Port 1 is connected to the antenna element 2 outside the quadplexer 1. In other words, the common terminal Port 1 also defines and functions as the antenna terminal of the quadplexer 1.

The individual terminals Port 11, Port 12, Port 21, and Port 22 are provided individually for the four filters 11, 12, 21, and 22 in this order, and are connected to corresponding filters inside the quadplexer 1. In addition, the individual terminals Port 11, Port 12, Port 21, and Port 22 are connected to an RF signal processing circuit (, for example, RFIC: Radio Frequency Integrated Circuit, not illustrated), with an amplifier circuit or other suitable circuit (not illustrated) interposed therebetween, outside the quadplexer 1.

The filter 11 is a reception filter disposed on a path connecting the common terminal Port 1 and the individual terminal Port 11 (reception terminal), and, in the present preferred embodiment, preferably has a passband, for example, that is a downlink frequency band (reception band) of Band 3.

The filter 12 is a transmission filter disposed on a path connecting the common terminal Port 1 and the individual terminal Port 12 (transmission terminal), and, in the present preferred embodiment, preferably has a passband, for example, that is an uplink frequency band (transmission band) of Band 3. In the present preferred embodiment, the filter 12 corresponds to a first filter disposed on a first path connecting the common terminal Port 1 and a first terminal (here, the individual terminal Port 12).

The filter 21 is a reception filter disposed on a path connecting the common terminal Port 1 and the individual terminal Port 21 (reception terminal), and, in the present preferred embodiment, preferably has a passband, for example, that is a downlink frequency band (reception band) of Band 1.

The filter 22 is a transmission filter disposed on a path connecting the common terminal Port 1 and the individual terminal Port 22 (transmission terminal), and, in the present preferred embodiment, preferably has a passband, for example, that is an uplink frequency band (transmission band) of Band 1. In the present preferred embodiment, the filter 22 corresponds to a second filter disposed on a second path connecting the common terminal Port 1 and a second terminal (here, the individual terminal Port 22).

These filters 11 and 12 define an unbalanced duplexer 10 (first duplexer) whose passband is Band 3. That is, the filter 12 is disposed on the first path connecting the common terminal Port 1 and the first terminal (here, the individual terminal Port 12). In addition, the filter 21 and the filter 22 define an unbalanced duplexer 20 (second duplexer) whose passband is Band 1. That is, the filter 22 is disposed on the second path connecting the common terminal Port 1 and the second terminal (here, the individual terminal Port 22). In other words, in the quadplexer 1 according to the present preferred embodiment a common terminal of the duplexer 10 whose passband is Band 3 and a common terminal of the duplexer 20 whose passband is Band 1 are defined by the common terminal Port 1. In the present preferred embodiment, a signal path going through the duplexer 10 and a signal path going through the duplexer 20 are connected at a node N. In other words, the node N is a point that bundles these two signal paths and is a common connection point of these two signal paths.

Frequency bands assigned to Band 1 and Band 3, which are preferably the passbands of the quadplexer 1 according to the present preferred embodiment, will be described. In the following description, a numerical range indicating A or greater and B or less is simplified as A to B.

Figure 2:
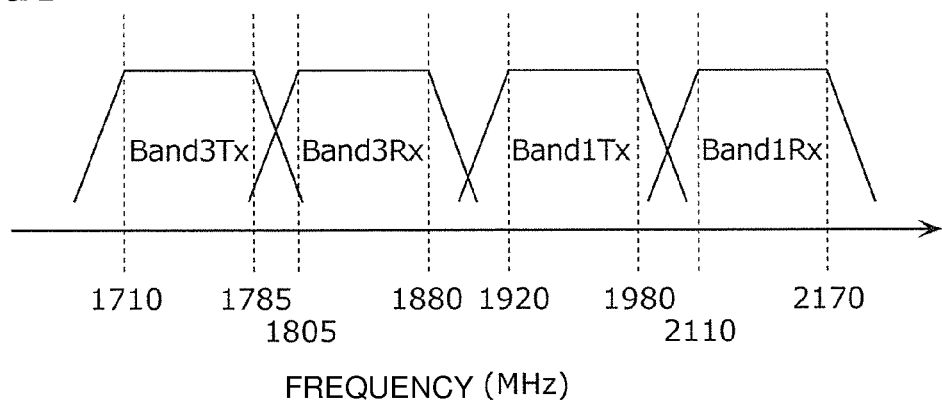
FIG. 2 is a diagram describing frequency bands assigned to Band 1 and Band 3.

FIG. 2 is a diagram describing frequency bands assigned to Band 1 and Band 3. Hereinafter, each Band's reception band (Rx) and transmission band (Tx) may be simplified as a band name and text added at the end thereof that describes a reception band or a transmission band, as in "Band 1 Rx band" for the reception band (Rx) of Band 1.

As illustrated in the diagram, for Band 1, about 1920 MHz to about 1980 MHz is assigned to the transmission band, and about 2110 MHz to about 2170 MHz is assigned to the reception band. For Band 3, about 1710 MHz to about 1785 MHz is assigned to the transmission band, and about 1805 MHz to about 1880 MHz is assigned to the reception band. Therefore, as the filter characteristics of the filters 11, 12, 21, and 22, characteristics that allow signals in the transmission band or reception band of a corresponding Band to pass but attenuate signals in other bands, as indicated by solid lines in the diagram, are required.

As has been described above, the quadplexer 1 includes the filter 12 (first filter) and the filter 22 (second filter) whose passband frequencies are higher than the filter 12. In addition, the quadplexer 1 includes the duplexer 10 (first duplexer) including two filters (filters 11 and 12 in the present preferred embodiment) including the filter 12 and the duplexer 20 (second duplexer) including two filters (filters 21 and 22 in the present preferred embodiment) including the filter 22.

Note that the passbands of the two duplexers 10 and 20 are not restricted to a combination of Band 3 and Band 1, and may be, for example, a combination of Band 25 and Band 66 or a combination of Band 3 and Band 7. In addition, in the quadplexer 1, an impedance element such as an inductor that provides impedance matching may be connected to a path connecting each of the filters 11, 12, 21, and 22 and the node N, a path connecting the node N and the common terminal Port 1, or other suitable path.

The basic configuration of the filters 11, 12, 21, and 22 will be described by using, for example, the basic configuration of the filter 12 (first filter) whose passband is Band 3 Tx.

Figure 3:
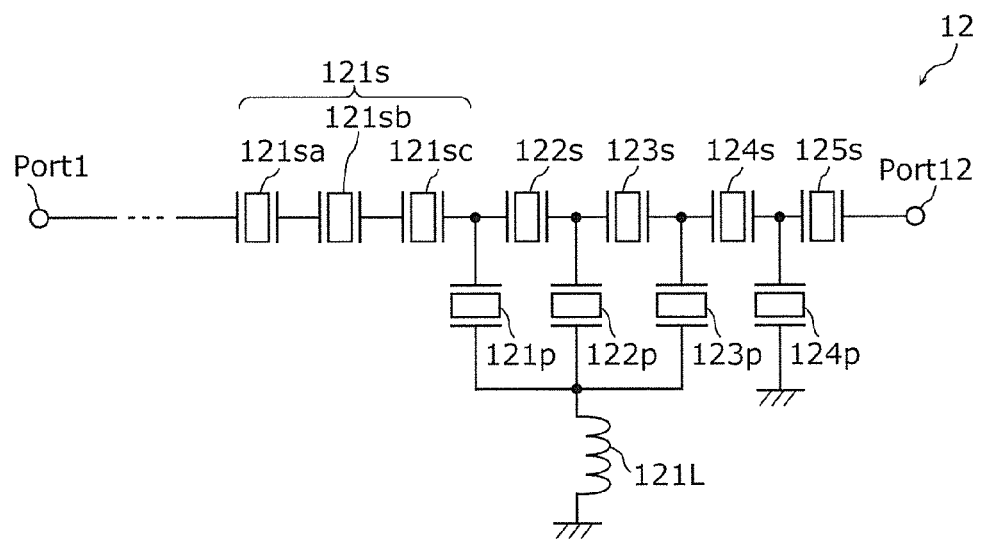
FIG. 3 is a circuit configuration diagram of a filter according to the first preferred embodiment of the present invention.

FIG. 3 is a circuit configuration diagram of the filter 12. As illustrated in the diagram, the filter 12 includes series resonators 121s to 125s, parallel resonators 121p to 124p, and an inductor 121L. Here, as illustrated in FIG. 3, the series resonator 121s, which is closest to the common terminal Port 1 (that is, an antenna terminal that is common to the duplexers 10 and 20), includes a plurality of (, for example, three in the present preferred embodiment) split resonators 121sa to 121sc. For the sake of simplicity, at first, the basic configuration of the filter 12 is described by treating the series resonator 121s as one element.

The series resonators 121s to 125s are connected in series with each other in this order from the common terminal Port 1 side, on a path (series arm) connecting the common terminal Port 1 and the individual terminal Port 12. In addition, the parallel resonators 121p to 124p are connected in parallel with each other on paths (parallel arms) connecting the connection points of the series resonators 121s to 125s and a reference terminal (ground). Specifically, the parallel resonators 121p to 123p are connected to the reference terminal with the inductor 121L interposed therebetween, and the parallel resonator 124p is directly connected to the reference terminal. With the above-described connection structure of the series resonators 121s to 125s and the parallel resonators 121p to 124p, the filter 12 is a ladder bandpass filter.

In this manner, the filter 12 (first filter) has a ladder filter structure including one or more series resonators (for example, five series resonators 121s to 125s in the present preferred embodiment) and one or more parallel resonators (for example, four parallel resonators 121p to 124p in the present preferred embodiment). Specifically, the filter 12 has a ladder filter structure including a plurality of stages (for example, four-stage in the present preferred embodiment). Accordingly, the bandpass characteristics of the entire filter 12 are able to be finely adjusted.

Note that the number of series resonators and the number of parallel resonators of the filter 12 are not restricted to five and four, respectively, and the filter 12 only needs to have one or more series resonators and one or more parallel resonators. In other words, the filter 12 only needs to have a ladder filter structure including one or more stages.

In addition, the parallel resonators 121p to 123p may be directly connected to the reference terminal without having the inductor 121L interposed therebetween, or the parallel resonator 124p may be connected to the reference terminal with an inductor interposed therebetween. In addition, an impedance element, such as an inductor, a capacitor, or other suitable element may be inserted or connected on the series arm or the parallel arms.

Although the reference terminal (ground) to which the parallel resonators 121p to 123p are connected is a common terminal and the reference terminal to which the parallel resonator 124p is connected is and individual terminal in FIG. 3, the common reference terminal and the individual reference terminal are not restricted to these, and may be arbitrarily selected in accordance with the mounting layout restriction of the filter 12, for example.

In addition, a parallel resonator may be connected to a node on the common terminal Port 1 side of the series resonator 121s, which is closest to the common terminal port 1, or a node on the individual terminal Port 12 side of the series resonator 125s, which is closest to the individual terminal Port 12, among the series resonators 121s to 125s defining the ladder filter structure.

Next, the plurality of (for example, three in the present preferred embodiment) split resonators 121sa to 121sc included in the series resonator 121s will be described.

The split resonators 121sa to 121sc are obtained by splitting the series resonator 121s and are connected in series without any of the parallel resonators 121p to 124p connected therebetween. In other words, the split resonators 121sa to 121sc define the series resonator 121s by being connected in series with each other without a connection node with another circuit element or another circuit element interposed therebetween.

These split resonators 121sa to 121sc include first and second split resonators whose design parameters are different from each other such that ripples included in their impedance characteristics are different from each other in a certain frequency range. Specifically, in the present preferred embodiment, the split resonators 121sa to 121sc have different design parameters such that ripples included in their impedance characteristics are different from each other in a certain frequency range. In other words, in the present preferred embodiment, for arbitrary two split resonators among the split resonators 121sa to 121sc, one corresponds to a first split resonator, and the other corresponds to a second split resonator; and, for example, the split resonator 121sa corresponds to the first split resonator, and the split resonator 121sb corresponds to the second split resonator.

Here, "certain frequency range" refers to a frequency range that is higher than the anti-resonant frequency of the series resonator 121s closest to the common terminal Port 1, that is defined by the pitch (electrode pitch, details will be described using FIG. 4) of a plurality of reflection electrode fingers 322c constituting each reflector 32c, and that is included in the passband of the filter 22 (second filter). The reflection electrode fingers 322c are the plurality of electrode fingers included in each reflector 32c, and are "electrode fingers of a reflector".

In addition, "ripples of impedance characteristics are different from each other" refers to the fact that, in comparison of first ripples appearing in the impedance characteristics of the first split resonator and second ripples appearing in the impedance characteristics of the second split resonator, the frequency components or phases of the ripples, the frequency positions at which the ripples appear, other characteristics are different from each other.

Note that the number of split resonators included in the series resonator 121s is not restricted to three and only needs to be two or more. In other words, the number of split resonators may be appropriately selected in accordance with the electrical characteristics, layout area, or other parameters required for the filter 12 or the quadplexer 1.

In addition, the plurality of split resonators (for example, three split resonators 121sa to 121sc in the present preferred embodiment) included in the series resonator 121s only need to include first and second split resonators whose design parameters are different from each other, and may include a third split resonator whose design parameters are the same or substantially the same as the first or second split resonator. For example, although it is stated in the present preferred embodiment that the split resonators 121sa to 121sc have design parameters that are different from each other, the split resonator 121sc (third split resonator) may have the same or substantially the same design parameters as one of the split resonators 121sa and 121sb.

In addition, the arrangement order of the first to third split resonators is not particularly restricted. For example, from the position closest to the common terminal Port 1 (that is, the antenna terminal common to the duplexers 10 and 20), the first, second, and third split resonators may be disposed in this order, or the first, third, and second split resonators may be disposed in this order.

The structure of resonators (split resonators, series resonators, and parallel resonators) included in the filter 12 (first filter) will be described below. In the present preferred embodiment, these resonators are preferably surface acoustic wave (SAW) resonators, for example.

Note that the other filters 11, 21, and 22 are not restricted to the above-described structure, and may be arbitrarily designed in accordance with the required filter characteristics and other factors. Specifically, the filters 11, 21, and 22 need not necessarily have a ladder filter structure, and may have, for example, a longitudinally coupled filter structure. In addition, the resonators included in the filters 11, 21, and 22 are not restricted to SAW resonators, and may be, for example, BAW (Bulk Acoustic Wave) resonators. Furthermore, the filters 11, 21, and 22 may not include resonators, and may be, for example, LC resonance filters or dielectric filters.

Figure 4:
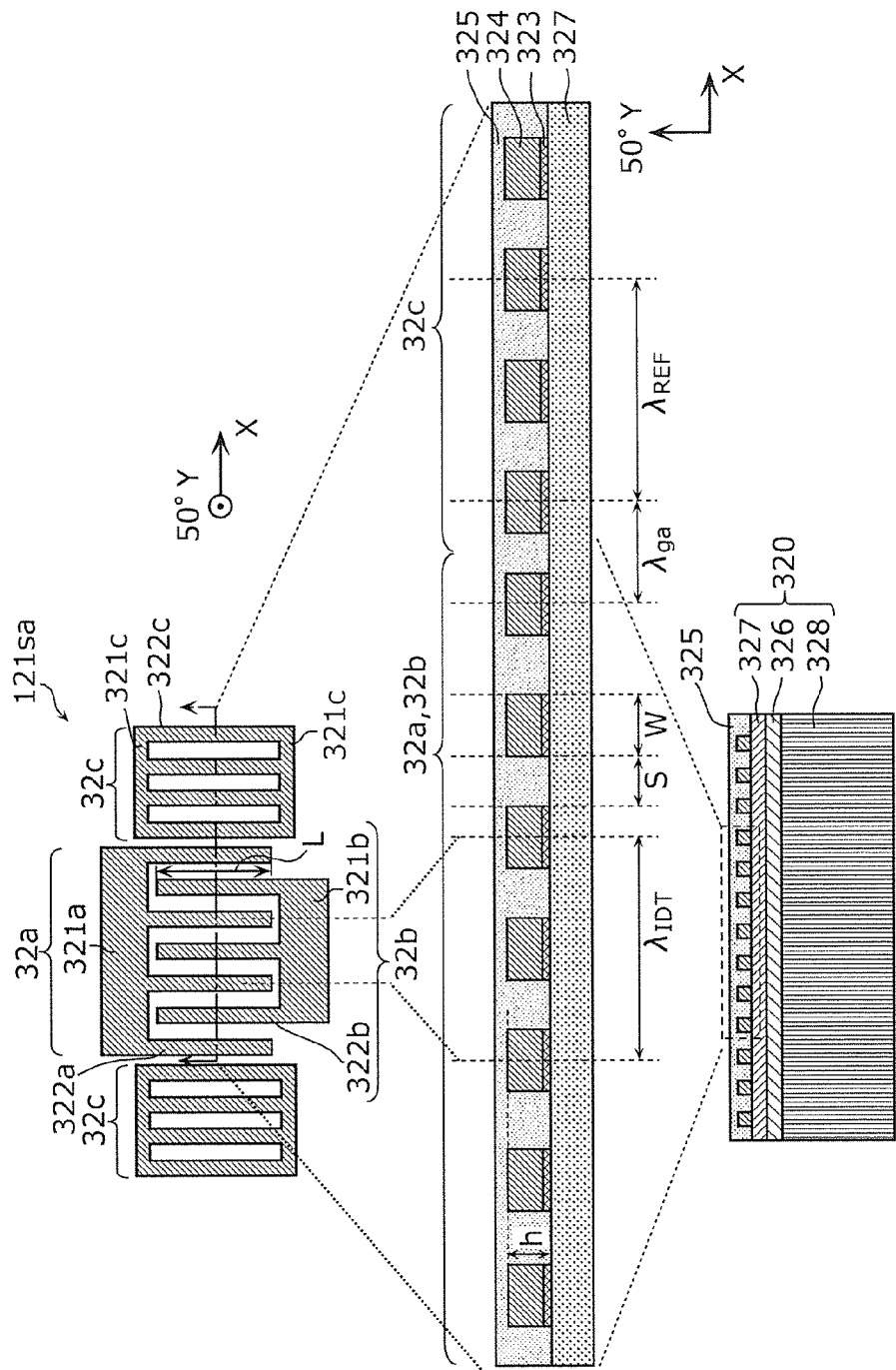
FIG. 4 includes a plan view and a sectional view schematically illustrating a resonator in the filter according to the first preferred embodiment of the present invention.

FIG. 4 includes a plan view and a sectional view schematically illustrating a resonator in the filter 12 according to the present preferred embodiment. FIG. 4 illustrates a schematic plan view and a schematic sectional view illustrating the structure of the split resonator 121sa among a plurality of resonators included in the filter 12. Note that the split resonator 121sa illustrated in FIG. 4 is a typical structure of the plurality of resonators, and the number and length of electrode fingers included in an electrode are not restricted to those of the split resonator 121sa.

As illustrated in the plan view of FIG. 4, the split resonator 121sa includes IDT (interdigital transducer) electrodes 32a and 32b, which excite elastic waves, and the reflectors 32c, which reflect the elastic waves excited by the IDT electrodes 32a and 32b. The reflectors 32c are disposed in a direction in which elastic waves propagate, with respect to the IDT electrodes 32a and 32b. Thus, the elastic waves excited by the IDT electrodes 32a and 32b is able to be efficiently confined, thus reducing or preventing leakage of the elastic waves to the outside. Therefore, the filter characteristics of the filter 12 are able to be improved. Specifically, the split resonator 121sa includes the pair of IDT electrodes 32a and 32b, which face each other, and the pair of reflectors 32c. Note that one of the pair of reflectors 32c may not be included, depending on the mounting layout restriction, for example.

The IDT electrode 32a includes a plurality of electrode fingers 322a, which have a comb shape and are parallel or substantially parallel with each other, and a busbar electrode 321a, which connects the plurality of electrode fingers 322a. In addition, the IDT electrode 32b is includes a plurality of electrode fingers 322b, which have a comb shape and are parallel or substantially parallel with each other, and a busbar electrode 321b, which connects the plurality of electrode fingers 322b. The plurality of electrode fingers 322a and 322b are disposed along a direction orthogonal or substantially orthogonal to the X-axis direction.

Here, among the split resonators 121sa to 121sc included in the series resonator 121s, the first and second split resonators have different design parameters such that the capacitances of the IDT electrodes 32a and 32b are equal or approximately equal. Accordingly, because the capacitances of the IDT electrodes 32a and 32b are equal or approximately equal in the first and second split resonators, the power durability performances of the first and second split resonators are equal or approximately equal to each other. Thus, the power durability performance of the entire series resonator 121s including the split resonators 121sa to 121sc is able to be improved. For example, the capacitance of the IDT electrodes 32a and 32b is proportional to the cross width, the number of pairs, and other parameters of the IDT electrodes 32a and 32b. In addition, "approximately equal" includes not only being exactly equal but also being approximately equal. That is, "approximately" includes an error of about a few percent.

Specifically, in the present preferred embodiment, all of the split resonators 121sa to 121sc have different design parameters such that the capacitances of the IDT electrodes 32a and 32b are equal or approximately equal. In other words, the power durability performance of the entire series resonator 121s is restricted by a split resonator with the lowest power durability performance among the split resonators 121sa to 121sc included in the series resonator 121s. Therefore, the capacitances of the IDT electrodes 32a and 32b in all of the split resonators 121sa to 121sc are equal or approximately equal such that their power durability performances are equal or approximately equal, thus improving the power durability performance of the entire series resonator 121s.

Note that the plurality of split resonators 121sa to 121sc only need to include first and second split resonators in which the capacitances of the IDT electrodes 32a and 32b are equal or approximately equal, and may include a third split resonator in which the capacitances of the IDT electrodes 32a and 32b are different from the first or second split resonator. For example, the split resonator 121sc (third split resonator) may include the IDT electrodes 32a and 32b whose capacitances are different from the split resonators 121sa and 121sb.

The pair of reflectors 32c are disposed in a direction in which elastic waves propagate (X-axis direction), with respect to the IDT electrodes 32a and 32b. Specifically, the pair or reflectors 32c sandwich the IDT electrodes 32a and 32b in a direction in which elastic waves propagate. Each reflector 32c includes a plurality of reflection electrode fingers 322c, which are parallel or substantially parallel to each other, and a pair of busbar electrodes 321c, including a busbar electrode that connects one of two end portions of the reflection electrode fingers 322c and a busbar electrode connecting the other end portion of the reflection electrode fingers 322c. The plurality of reflection electrode fingers 322c are disposed along a direction orthogonal or substantially orthogonal to the X-axis direction, similar to the plurality of electrode fingers 322a and 322b.

The pair of reflectors 32c confine standing waves of the propagating elastic waves without leaking to the outside of the resonator (here, the split resonator 121sa). In doing so, the resonator is able to propagate RF signals in the passband defined by the electrode pitch, the number of pairs, the cross width, and other parameters of the IDT electrodes 32a and 32b with low loss while highly attenuating RF signals outside the passband.

In addition, the IDT electrodes 32a and 32b including the plurality of electrode fingers 322a and 322b and the busbar electrodes 321a and 321b preferably have a multilayer structure including an adhesion layer 323 and a main electrode layer 324, as illustrated in the sectional view of FIG. 4. In addition, because the cross-sectional structure of the reflectors 32c is the same or substantially the same as the cross-sectional structure of the IDT electrodes 32a and 32b, a description thereof will be omitted.

The adhesion layer 323 improves the adhesion between a piezoelectric layer 327 and the main electrode layer 324, and, for example, Ti is preferably used as a material of the adhesion layer 323. The film thickness of the adhesion layer 323 is preferably, for example, about 12 nm.

As a material of the main electrode layer 324, for example, Al including about 1% of Cu is preferably used. The film thickness of the main electrode layer 324 is preferably, for example, about 162 nm.

A protection layer 325 covers the IDT electrodes 32a and 32b. The protection layer 325 protects the main electrode layer 324 from the external environment, adjusts the frequency temperature characteristics, and improves the moisture resistance, and is a film whose main component is preferably, for example, silicon dioxide. The film thickness of the protection layer 325 is preferably, for example, about 25 nm.

Note that the materials used for the adhesion layer 323, the main electrode layer 324, and the protection layer 325 are not restricted to those described above. Furthermore, the IDT electrodes 32a and 32b need not have the above-described multilayer structure. The IDT electrodes 32a and 32b may be made of a metal or an alloy such as Ti, Al, Cu, Pt, Au, Ag, and Pd, or may include a plurality of multilayer bodies made of the above-described metals or alloys. In addition, the protection layer 325 need not be provided.

The above-described IDT electrodes 32a and 32b and reflectors 32c are provided on a main surface of a substrate 320. Hereinafter, the multilayer structure of the substrate 320 will be described.

As illustrated in a lower portion of FIG. 4, the substrate 320 includes a high-acoustic-velocity supporting substrate 328, a low-acoustic-velocity film 326, and the piezoelectric layer 327 in which the high-acoustic-velocity supporting substrate 328, the low-acoustic-velocity film 326, and the piezoelectric layer 327 are laminated in this order.

The piezoelectric layer 327 includes a main surface on which the IDT electrodes 32a and 32b and the reflectors 32c are disposed. The piezoelectric layer 327 is preferably made of, for example, a 50° Y-cut X-propagation $LiTaO_3$ piezoelectric single crystal or piezoelectric ceramics (lithium tantalate single crystal cut along a face that has, as a normal, an axis rotated by about 50° from the Y-axis around the X-axis serving as the central axis or ceramics, which is single crystal or ceramics in which surface acoustic waves propagate in the X-axis direction). The thickness of the piezoelectric layer 327 is preferably less than or equal to about $3.5\lambda$, for example, where $\lambda$ is the wavelength of elastic waves defined by the electrode pitch (electrode cycle) of the IDT electrodes 32a and 32b, and is preferably, for example, about 600 nm.

The high-acoustic-velocity supporting substrate 328 supports the low-acoustic-velocity film 326, the piezoelectric layer 327, and the IDT electrodes 32a and 32b. The high-acoustic-velocity supporting substrate 328 is a substrate in which the acoustic velocity of bulk waves propagating through the high-acoustic-velocity supporting substrate 328 is higher than that of elastic waves such as surface waves or boundary waves propagating through the piezoelectric layer 327, and confines surface acoustic waves in a portion at which the piezoelectric layer 327 and the low-acoustic-velocity film 326 are laminated, thus preventing the surface acoustic waves from leaking downward below the high-acoustic-velocity supporting substrate 328. The high-acoustic-velocity supporting substrate 328 is preferably, for example, a silicon substrate, and has a thickness of about 125 μm, for example. Note that the high-acoustic-velocity supporting substrate 328 may be made of any of the following: (1) aluminum nitride, aluminum oxide, silicon carbide, silicon nitride, silicon, sapphire, a piezoelectric body such as lithium tantalate, lithium niobate, or crystal; (2) various types of ceramics such as alumina, zirconia, cordierite, mullite, steatite, and forsterite; (3) magnesia diamond; (4) a material mainly including the above materials; and (5) a material mainly including a mixture of the above materials.

The low-acoustic-velocity film 326 is a film in which the acoustic velocity of bulk waves in the low-acoustic-velocity film 326 is lower than that of elastic waves propagating through the piezoelectric layer 327, and is disposed between the piezoelectric layer 327 and the high-acoustic-velocity supporting substrate 328. With this structure and the essential characteristic that energy is concentrated in a medium in which the acoustic velocity of elastic waves is low, leakage of SAW energy to the outside of the IDT electrodes is reduced or prevented. The low-acoustic-velocity film 326 is preferably, for example, a film that includes silicon dioxide as a main component. The thickness of the low-acoustic-velocity film 326 is preferably less than or equal to about $2\lambda$ where $\lambda$ is the wavelength of elastic waves defined by the electrode pitch of the IDT electrodes 32a, 32b, and is preferably, for example, about 670 nm.

According to the above-mentioned multilayer structure of the substrate 320, compared with a conventional structure that includes a piezoelectric substrate as a single layer, the Q factor at the resonant frequency and the anti-resonant frequency is able to be greatly increased. That is, because a SAW resonator with a high Q factor is provided, a filter with a low insertion loss is able to be provided using the SAW resonator.

Note that the high-acoustic-velocity supporting substrate 328 may have a structure in which a supporting substrate and a high-acoustic-velocity film are laminated, in which the acoustic velocity of bulk waves propagating through the high-acoustic-velocity film is higher than that of elastic waves such as surface waves or boundary waves propagating through the piezoelectric layer 327. In this case, the supporting substrate may be made of the following materials: sapphire, a piezoelectric body such as lithium tantalate, lithium niobate, or crystal; various types of ceramics such as alumina, magnesia, silicon nitride, aluminum nitride, silicon carbide, zirconia, cordierite, mullite, steatite, and forsterite; a dielectric such as glass; semiconductor such as silicon or gallium nitride; resin substrate; and other suitable materials. In addition, the high-acoustic-velocity film may be made of various high-acoustic-velocity materials as follows: aluminum nitride, aluminum oxide, silicon carbide, silicon nitride, silicon oxynitride, DLC film, or diamond; a medium mainly including the above-mentioned materials; and a medium mainly including a mixture of the above-mentioned materials.

Although the example in which the IDT electrodes 32a and 32b included in the filter 12 are provided on the substrate 320 including the piezoelectric layer 327 has been described in the present preferred embodiment, a substrate on which the IDT electrodes 32a and 32b are provided may be a piezoelectric substrate including a single layer of the piezoelectric layer 327. The piezoelectric substrate in this case is preferably made of, for example, $LiTaO_3$ piezoelectric single crystal or another piezoelectric single crystal such as $LiNbO_3$.

In addition, a substrate on which the IDT electrodes 32a and 32b are provided may include a piezoelectric layer that is laminated on a supporting substrate, besides a structure that is entirely made of a piezoelectric layer, as long as the structure includes a piezoelectric layer.

In addition, although the piezoelectric layer 327 according to the above-described present preferred embodiment uses a 50° Y-cut X-propagation LiTaO$_3$ piezoelectric single crystal, the cut angle of the single crystal material is not restricted to this. In other words, the multilayer structure, materials, and thickness may be appropriately changed in accordance with the bandpass characteristics required for the elastic wave filter apparatus, and the same or similar advantageous effects are able to be achieved even with a SAW filter using a LiTaO$_3$ piezoelectric substrate or a LiNbO$_3$ piezoelectric substrate with a cut angle different from the above cut angle.

The design parameters of the resonators will be described.

Design parameters regarding the IDT electrodes 32a and 32b will be described.

The wavelength of a SAW resonator is defined by a wavelength $\lambda_{IDT}$ (hereinafter, an IDT wavelength $\lambda_{IDT}$) which is a repetition cycle of the electrode fingers 322a or 322b included in the IDT electrodes 32a and 32b illustrated in a middle portion of FIG. 4. In addition, the electrode pitch (electrode cycle) is half of the IDT wavelength $\lambda_{IDT}$ and is defined by (W+S) where W is the line width of the electrode fingers 322a and 322b included in the IDT electrodes 32a and 32b and S is the space width between the adjacent electrode fingers 322a and 322b. In addition, the cross width L of the IDT electrodes 32a and 32b is the length of electrode fingers that overlap each other when viewed from the X-axis direction of the electrode fingers 322a of the IDT electrode 32a and the electrode fingers 322b of the IDT electrode 32b, as illustrated in an upper part of FIG. 4. In addition, the electrode duty of each resonator is the line width occupancy of the electrode fingers 322a and 322b, which is the line width ratio relative to the sum of the line width and the space width of the electrode fingers 322a and 322b, and which is defined by W/(W+S).

Next, design parameters regarding the reflectors 32c will be described.

The wavelength $\lambda_{REF}$ of each of the reflectors 32c (hereinafter, the REF wavelength $\lambda_{REF}$) is twice the repetition cycle of the reflection electrode fingers 322c included in each reflector 32c, and is specifically twice the center-to-center distance of two reflection electrode fingers 322c disposed next to each other.

Parameters regarding the relative arrangement of the IDT electrodes 32a and 32b and the reflectors 32c will be described.

The distance between the IDT electrodes 32a and 32b and each of the reflectors 32c (hereinafter, the IDT-reflector spacing $\lambda_{ga}$) is the ratio of the distance between the IDT electrodes 32a and 32b and each of the reflectors 32c relative to the IDT wavelength $\lambda_{IDT}$. Specifically, the IDT-reflector spacing $\lambda_{ga}$ is the center-to-center distance between (i) the electrode finger closest to each of the reflectors 32c among the electrode fingers 322a and 322b included in the IDT electrodes 32a and 32b and (ii) the reflection electrode finger 322c closest to the IDT electrodes 32a and 32b among the reflection electrode fingers 322c included in each of the reflectors 32c. In other words, the IDT-reflector spacing $\lambda_{ga}$ is the center-to-center distance between the electrode finger 322a, 322b and the reflection electrode finger 322c adjacent to each other in a direction in which elastic waves propagate.

In a multiplexer that bundles a plurality of filters, typically the configuration in each filter is designed in a manner equivalent to the case of using the filter alone. However, the inventor of preferred embodiments of the present invention recognized that there is a problem in such a multiplexer (the quadplexer 1 in the present preferred embodiment) that one filter's configuration causes ripples in the passband of another filter, as illustrated in FIG. 5.

Figure 5:
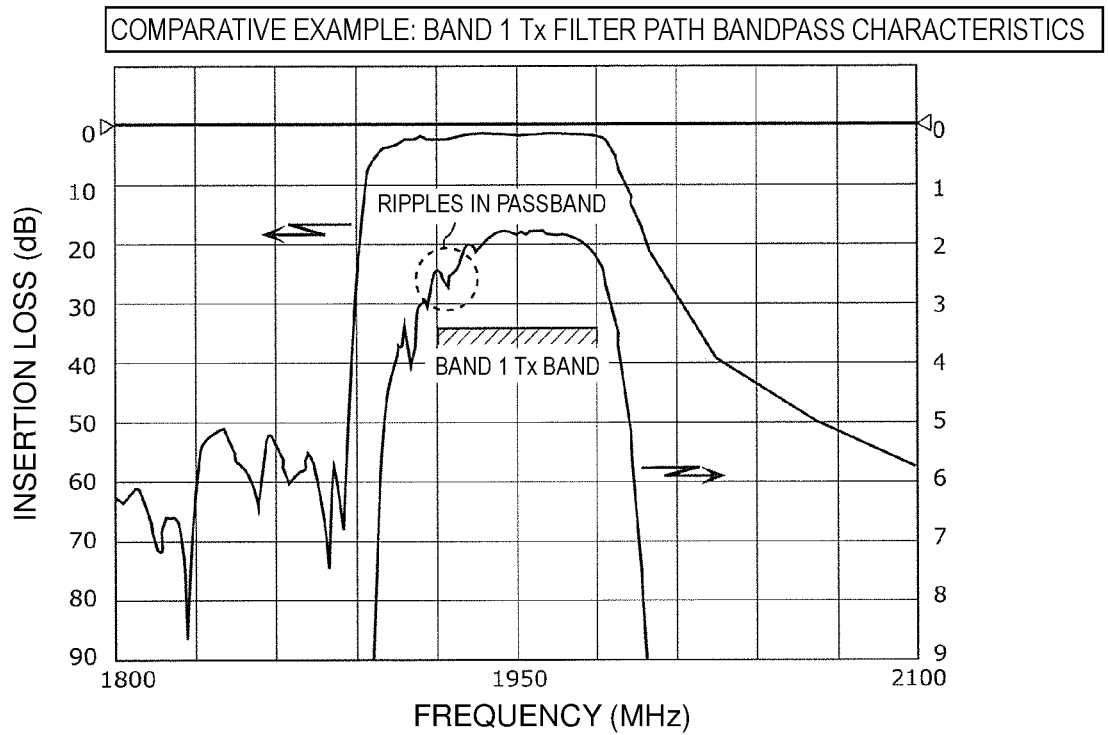
FIG. 5 is a graph illustrating a problem that occurs in a comparative example.

FIG. 5 is a graph illustrating a problem that occurs in a comparative example described below. Specifically, the graph illustrates the bandpass characteristics of a path that goes through the filter 22 (Band 1 Tx filter) in the case in which the series resonator 121s closest to the common terminal Port 1 includes one resonator. More specifically, the graph illustrates an insertion loss which is the ratio of the intensity of a signal output from one of the individual port 22 and the common terminal Port 1 relative to the intensity of a signal input to the other of the individual port 22 and the common terminal Port 1.

As illustrated in FIG. 5, in the case in which the series resonator 121s includes one resonator, ripples are generated in the Band 1 Tx band (that is, the passband of the filter 22) ("ripples in passband" portion in the graph).

In contrast, the inventor of preferred embodiments of the present invention discovered that, in such a multiplexer, the ripples generated in the passband are able to be reduced or prevented by structuring the series resonator 121s to include the split resonators 121sa to 121sc in the filter 12 whose passband is lower than the filter 22 and by making the design parameters of at least one of the split resonators 121sa to 121sc different from the design parameters of another of the split resonators 121sa to 121sc.

Advantageous effects that ripples generated in the passband are able to be reduced or prevented will be described in detail based on an example and a comparative example.

Table 1 indicates the details of the design parameters (IDT wavelength $\lambda_{IDT}$ (electrode pitch×2), REF wavelength $\lambda_{REF}$ (electrode pitch×2), cross width L, IDT number-of-pairs $N_{IDT}$, number of reflection electrode fingers $N_{REF}$, IDT-reflector spacing $\lambda_{ga}$, and electrode duty D) of the series resonators 121s to 125s and the parallel resonators 121p to 124p included in the filter 12 according to an example of a preferred embodiment of the present invention. Because the series resonator 121s includes three split resonators 121sa to 121sc, Table 1 indicates, as the design parameters of the split resonator 121s, the details of the design parameters of each of the split resonators 121sa to 121sc.

TABLE 1

| | SERIES RESONATOR 121s | | | | | | |
|---|---|---|---|---|---|---|---|
| | SPLIT RESONATOR 121sa | SPLIT RESONATOR 121sb | SPLIT RESONATOR 121sc | SERIES RESONATOR 122s | SERIES RESONATOR 123s | SERIES RESONATOR 124s | SERIES RESONATOR 125s |
| IDT WAVELENGTH $\lambda_{IDT}$ (μm) | 2.140 | 2.142 | 2.144 | 2.1678 | 2.1646 | 2.1694 | 2.1445 |
| REF WAVELENGTH $\lambda_{REF}$ (μm) | " | " | " | " | " | " | " |

TABLE 1-continued

| | | | | | | | |
|---|---|---|---|---|---|---|---|
| CROSS WIDTH L (μm) | 31.7 | 28.8 | 26.4 | 33 | 18 | 20.1 | 18.7 |
| IDT NUMBER OF PAIRS $N_{IDT}$ | 250 | 275 | 300 | 107 | 128 | 190 | 140 |
| NUMBER OF REFLECTION ELECTRODE FINGERS $N_{REF}$ | 21 | 21 | 21 | 21 | 21 | 21 | 21 |
| IDT-REFLECTOR SPACING $\lambda_{ga}$ | 0.5 | 0.5 | 0.5 | 0.5 | 0.5 | 0.5 | 0.5 |
| ELECTRODE DUTY D | 0.5 | 0.5 | 0.5 | 0.5 | 0.5 | 0.5 | 0.5 |

| | PARALLEL RESONATOR 121p | PARALLEL RESONATOR 122p | PARALLEL RESONATOR 123p | PARALLEL RESONATOR 124p |
|---|---|---|---|---|
| IDT WAVELENGTH $\lambda_{IDT}$ (μm) | 2.2506 | 2.2398 | 2.2507 | 2.2508 |
| REF WAVELENGTH $\lambda_{REF}$ (μm) | " | " | " | " |
| CROSS WIDTH L (μm) | 48.8 | 32.8 | 82 | 80 |
| IDT NUMBER OF PAIRS $N_{IDT}$ | 113 | 108 | 38 | 60 |
| NUMBER OF REFLECTION ELECTRODE FINGERS $N_{REF}$ | 21 | 21 | 21 | 21 |
| IDT-REFLECTOR SPACING $\lambda_{ga}$ | 0.5 | 0.5 | 0.5 | 0.5 |
| ELECTRODE DUTY D | 0.5 | 0.5 | 0.5 | 0.5 |

As indicated in Table 1, the cross width L and the IDT number-of-pairs $N_{IDT}$ are different among the split resonators 121sa to 121sc in the present example. In other words, the cross width L and the IDT number-of-pairs $N_{IDT}$ are design parameters that are different among the split resonators 121sa to 121sc.

Design parameters that are different among the split resonators 121sa to 121sc are not restricted to the cross width L and the IDT number-of-pairs $N_{IDT}$, and may be at least one of the IDT wavelength $\lambda_{IDT}$, the cross width L (the cross width of the electrode fingers 322a and 322b), the IDT number-of-pairs $N_{IDT}$ (the number of pairs of the electrode fingers 322a and 322b), the electrode duty D, and the IDT-reflector spacing $\lambda_{ga}$ (distance between the IDT electrodes 32a and 32b and each of the reflectors 32c). Accordingly, the design parameters are easily made different by making the width or length of the electrode fingers 322a and 322b or the distance between the IDT electrodes 32a and 32b and each of the reflectors 32c different in a process of manufacturing the quadplexer 1.

In addition, design parameters that are different among the split resonators 121sa to 121sc are not restricted to those in the present example, and may be, for example, the thickness and material of at least one of members defining the substrate 320 (at least one of the high-acoustic-velocity supporting substrate 328, the low-acoustic-velocity film 326, and the piezoelectric layer 327 in the present preferred embodiment).

A filter according to a comparative example has the same or substantially the same configuration as the filter 12 according to the example described above, except that the series resonator 121s includes one resonator. Table 2 indicates the details of the design parameters (IDT wavelength $\lambda_{IDT}$, REF wavelength $\lambda_{REF}$, cross width L, IDT number-of-pairs $N_{IDT}$, number of reflection electrode fingers $N_{REF}$, IDT-reflector spacing $\lambda_{ga}$, and electrode duty D) of the series resonator 121s included in the filter according to the comparative example. Because the design parameters of resonators other than the series resonator 121s are the same or substantially the same as those in the example described above, descriptions thereof will be omitted.

TABLE 2

| | SERIES RESONATOR 121s |
|---|---|
| IDT WAVELENGTH $\lambda_{IDT}$ (μm) | 2.142 |
| REF WAVELENGTH $\lambda_{REF}$ (μm) | " |
| CROSS WIDTH L (μm) | 17.6 |
| IDT NUMBER OF PAIRS $N_{IDT}$ | 150 |
| NUMBER OF REFLECTION ELECTRODE FINGERS $N_{REF}$ | 21 |
| IDT-REFLECTOR SPACING $\lambda_{ga}$ | 0.5 |
| ELECTRODE DUTY D | 0.5 |

Figure 6:
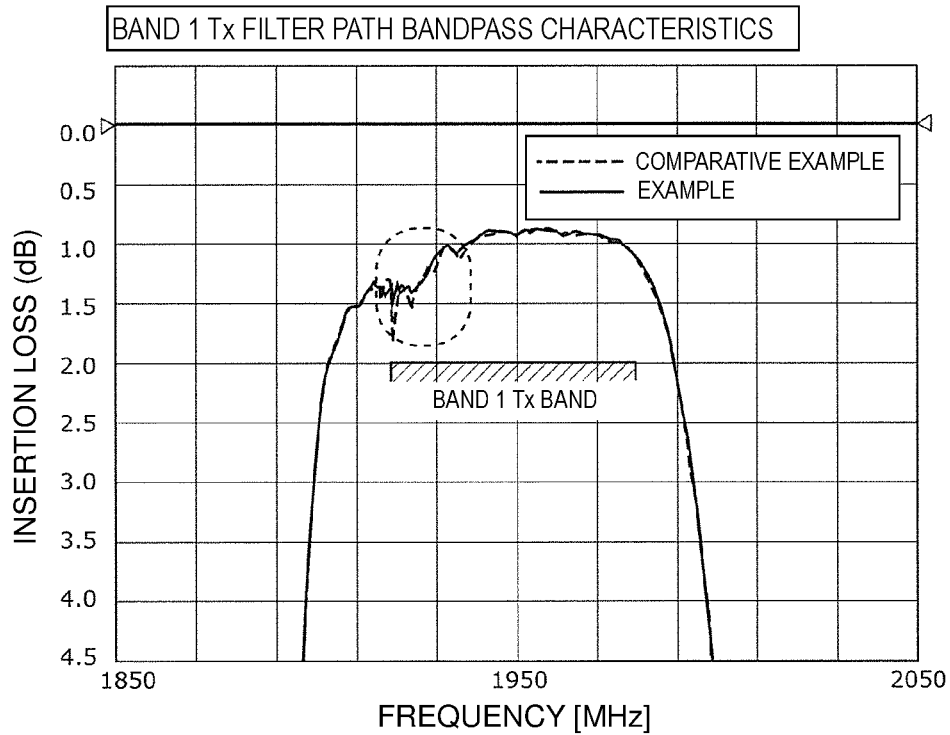
FIG. 6 is a graph illustrating the bandpass characteristics of a quadplexer according to an example of a preferred embodiment of the present invention in comparison with the comparative example.

FIG. 6 is a graph illustrating the bandpass characteristics of the quadplexer 1 according to the example in comparison with the comparative example. Specifically, the graph illustrates the bandpass characteristics of a path that goes through the filter 22 (Band 1 Tx filter), and more specifically illustrates an insertion loss which is the ratio of the intensity of a signal output from the common terminal Port 1 relative to the intensity of a signal input to the individual terminal Port 22.

As is clear from the graph, compared with a comparative example, ripples in the passband (here, in the Band 1 Tx band) are reduced in the example (a portion enclosed by a broken line in the graph).

This is because of the following reasons.

Figure 7:
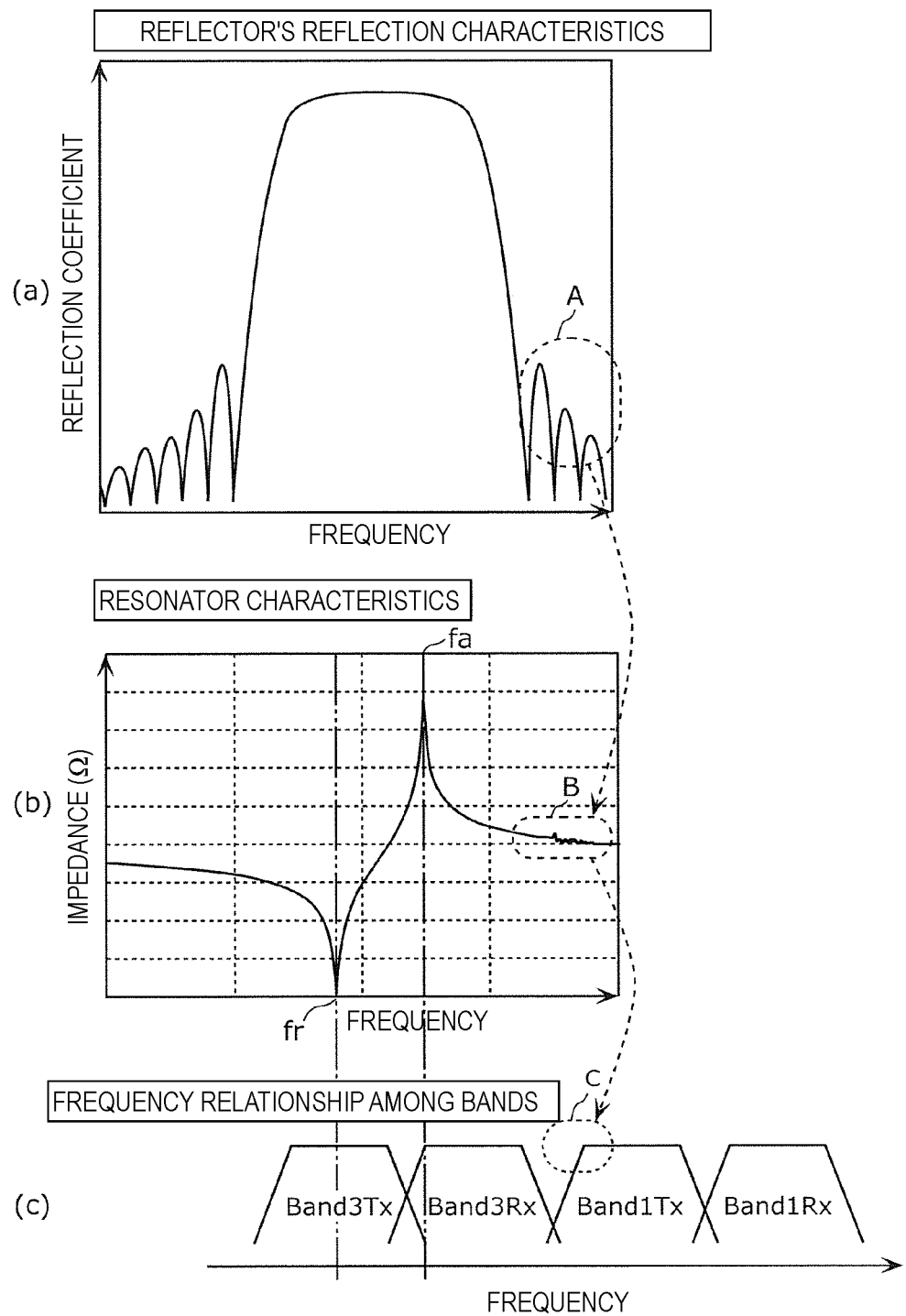
FIG. 7 includes diagrams conceptually illustrating a factor causing ripples in the passband in the comparative example.

FIG. 7 includes diagrams conceptually illustrating a factor causing ripples in the passband in the comparative example. Part (a) of FIG. 7 is a graph schematically illustrating the reflection characteristics of the reflectors 32c included in the resonator, which specifically illustrates the frequency characteristics of the reflection coefficient. Part (b) of FIG. 7 is a graph schematically illustrating the resonance characteristics of the resonator, which specifically illustrates the frequency characteristics (so-called impedance characteristics) of the impedance of the resonator. Part (c) of FIG. 7 is a diagram describing the frequency relationship between Band 1 and Band 3, as in FIG. 2, and filter characteristics required for each of the filters 11, 12, 21, and 22 are schematically indicated by a solid line.

The reflectors 32c are designed to have a high reflection coefficient in a certain band including the resonant frequency of the resonator in order to confine the propagated surface acoustic waves without leaking to the outside.

At this time, as illustrated in part (a) of FIG. 7, bouncing back of the reflection coefficient, which is the repetition of the reflection coefficient becoming greater and smaller, occurs in a peripheral band of a certain band at which the reflection coefficient is high (A portion in the graph).

In the SAW resonator, due to this bouncing back of the reflection coefficient, as illustrated in part (b) of FIG. 7, ripples are generated in the impedance characteristics at frequencies higher than the resonance characteristics (that is, at frequencies higher than both of a resonant frequency fr and an anti-resonant frequency fa) (B portion in the graph).

In general, a filter with a ladder filter structure defines a bandpass filter that has a resonant frequency frs of a series resonator and an anti-resonant frequency fap of a parallel resonator as the center frequency of the passband by substantially matching frs and fap. Therefore, if a SAW resonator is used as a series resonator in a ladder filter structure, stopband ripples (ripples generated in a stopband) are caused by the ripples in a stopband that is on the higher frequency side of the bandpass filter.

Such stopband ripples do not matter much in the filter alone. However, in a multiplexer including a plurality of filters, in the case in which a frequency at which stopband ripples occur in one filter is positioned in another filter's passband, the stopband ripples may increase ripples (passband ripples) in the other filter's passband.

At this time, in a multiplexer (quadplexer) including the Band-3 duplexer 10 and the Band-1 duplexer 20, in the case in which the series resonator 121s in the filter 12 for the Band 3 Tx band includes one resonator, as in the comparative example, ripples caused by the series resonator 121s are located in the Band 1 Tx band (see FIG. 7(b) and (c)). Therefore, in the comparative example, ripples are generated in the passband on a path that goes through the filter 22 (Band 1 Tx filter).

In contrast, in the example described above, the series resonator 121s in the filter 12 includes the split resonators 121sa to 121sc that have different design parameters such that ripples of their impedance characteristics are different from each other in a certain frequency range.

Accordingly, for the filter 12, in the certain frequency range, ripples of the impedance characteristics are different among the split resonators 121sa to 121sc. Therefore, ripples in the passband of the filter 22, which is bundled with the filter 12, are able to be reduced or prevented.

That is, the impedance characteristics of the SAW resonator include ripples whose frequency, phase, and other design parameters are defined by the pitch $\lambda_{REF}$ of the reflection electrode fingers 322c on a higher frequency side of the stopband of the reflectors 32c. Thus, in the case in which the series resonator 121s, which is closest to the common terminal Port 1 in the filter 12 (first filter), includes one SAW resonator, and ripples caused by the SAW resonator are located in the passband of the filter 22 (second filter), the effects of ripples of the series resonator 121s appear in the passband.

In contrast, when the series resonator 121s includes the split resonators 121sa to 121sc that have different design parameters such that ripples of their impedance characteristics are different from each other in a certain frequency range, as in the example described above, ripples caused by SAW resonators individually defining the split resonators 121sa to 121sc are different from each other. Thus, even in the case in which ripples caused by the SAW resonators are located in the passband of the filter 22, because the frequency positions, frequency components, phases, and other design parameters of the ripples are different from each other, the effects of the ripples of the split resonators 121sa to 121sc that appear in the passband of the filter 22 (second filter) cancel each other out (are smoothed).

In this manner, in the example described above, as compared with the comparative example, ripples caused by the series resonator 121s in the filter 12 are smoothed in the passband of the filter 22, thus reducing or preventing ripples in the passband.

Specifically, in the above-described example, as compared with the comparative example, because ripples are different from each other by having different design parameters, the quadplexer 1 (multiplexer) capable of smoothing ripples caused by the filter 12 is able to be easily manufactured.

In particular, in the above-described example, all of the split resonators 121sa to 121sc included in the series resonator 121s have different design parameters such that ripples are different from each other in a certain frequency range. Therefore, compared with the case in which only one split resonator (such as the split resonator 121sa) has different design parameters from the other split resonators (such as the split resonators 121sb and 121sc ), ripples of the split resonators 121sa to 121sc appearing in the passband of the filter 22 (second filter) are able to be further reduced or prevented.

In addition, in the above-described example, a first split resonator (such as the split resonator 121sa) and a second split resonator (such as the split resonator 121sb ) included in the series resonator 121s have different design parameters from each other such that the capacitances of the IDT electrodes 32a and 32b are equal or approximately equal to each other. Accordingly, compared with the case in which the first and second split resonators have different capacitances, the magnitude of ripples of the impedance characteristics is able to be equal or approximately equal in the first and second split resonators. Therefore, ripples caused by the filter 12 (first filter) are further smoothed, thus further reducing or preventing ripples in the passband of the filter 22 (second filter).

In particular, in the above-described example, all of the split resonators 121sa to 121sc included in the series resonator 121s have different design parameters such that the capacitances are equal or approximately equal to each other. Accordingly, the magnitude of ripples of the impedance characteristics are equal or approximately equal in the all of the split resonators 121sa to 121sc. Therefore, ripples of the filter 12 are able to be further smoothed, thus further reducing or preventing ripples in the passband of the filter 22.

In addition, in the above-described example, as the design parameters, the first split resonator (such as the split resonator 121sa) and the second split resonator (such as the split resonator 121sb ) included in the series resonator 121s have at least one of the electrode pitch, the cross width L, the IDT number-of-pairs $N_{IDT}$, and the electrode duty D of the electrode fingers 322a or 322b and the IDT-reflector spacing $\lambda_{ga}$ different from each other.

Accordingly, for the first split and second split resonators, the magnitude, phase, and frequency of ripples of the impedance characteristics, or frequency at which the ripples are generated is different from each other. Therefore, ripples caused by the filter 12 are able to be further smoothed, thus further reducing or preventing ripples in the passband of the filter 22.

In the above-described first preferred embodiment, for the first filter (filter 12 in the first preferred embodiment), a configuration that only includes a ladder filter structure has been described by way of example. However, the first filter may include, in addition to the ladder filter structure, a longitudinally-coupled filter structure. In the present modification of the first preferred embodiment, a quadplexer including a first filter that has such a filter structure will be described. Among a plurality of filters included in the quadplexer, filters other than the first filter have a configuration that is the same as or similar to that of the first preferred embodiment, and therefore descriptions thereof will be omitted.

Figure 8:
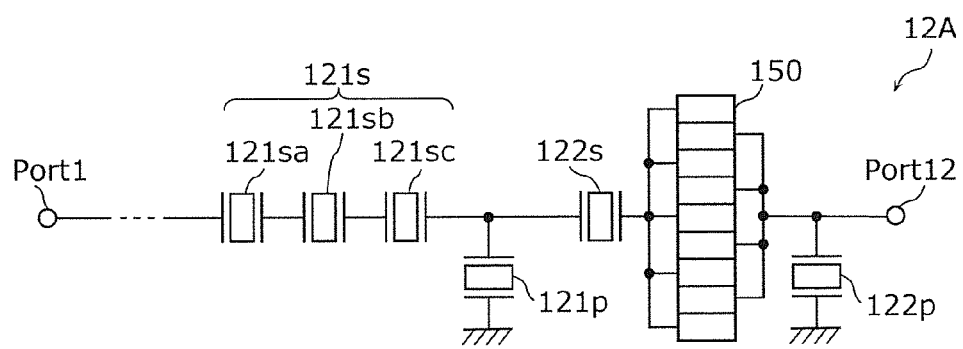
FIG. 8 is a circuit configuration diagram of a filter according to a modification of the first preferred embodiment of the present invention.

FIG. 8 is a circuit configuration diagram of a filter 12A (first filter) according to the modification of the first preferred embodiment.

As illustrated in the diagram, the filter 12A includes series resonators 121s and 122s, parallel resonators 121p and 122p, and a longitudinally-coupled resonator 150. In other words, the filter 12A includes the longitudinally-coupled resonator 150 in addition to the ladder filter structure.

The longitudinally-coupled resonator 150 has a longitudinally-coupled filter structure disposed between the common terminal Port 1 and the individual terminal Port 12. In the present modification, the longitudinally-coupled resonator 150 is disposed on the individual terminal Port 12 side of the series resonator 122s, and preferably includes, for example, nine IDTs and reflectors disposed on both sides of the IDTs. Note that the position at which the longitudinally-coupled resonator 150 is disposed is not restricted to this, and, for example, the position may be between the series resonator 121s and the series resonator 122s or on the common terminal Port 1 side of the series resonator 121s.

Even in a quadplexer including the first filter (filter 12A in the present modification) configured as described above, as in the first preferred embodiment, ripples in the passband are able to be reduced or prevented by structuring a series resonator (the series resonator 121s in the present preferred embodiment) closest to the common terminal Port 1 to include the split resonators 121sa to 121sc.

In addition, with the filter 12A according to the modification of the present preferred embodiment, the quadplexer is able to be adapted to the required filter characteristics, such as attenuation enhancement by having a longitudinally-coupled filter structure.

Second Preferred Embodiment

The quadplexer according to the above-described first preferred embodiment and its modification is applicable to an RF front-end circuit and further to a communication apparatus including the RF front-end circuit. In a second present preferred embodiment of the present invention, such an RF front-end circuit and a communication apparatus will be described.

Figure 9:
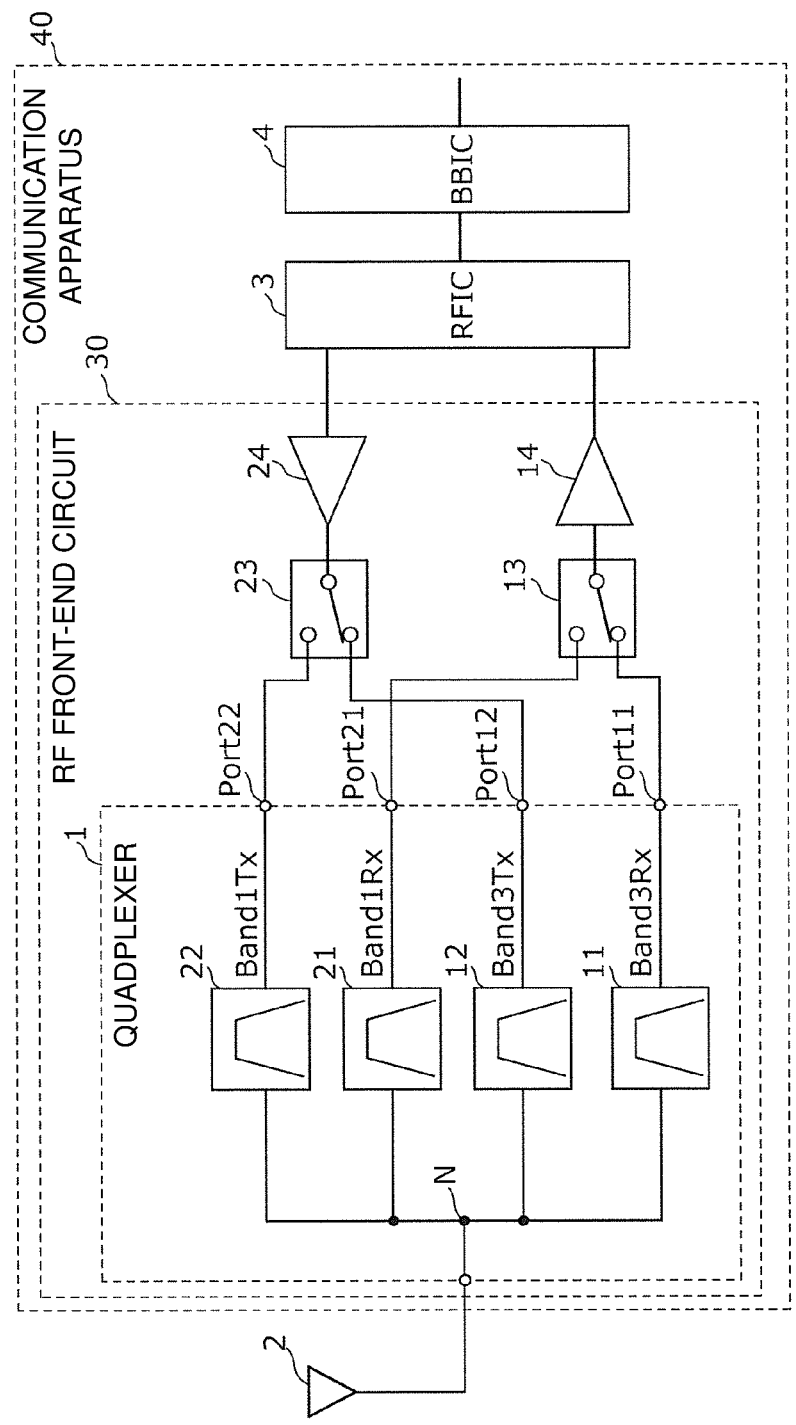
FIG. 9 is a configuration diagram of an RF front-end circuit according to a second preferred embodiment of the present invention.

FIG. 9 is a configuration diagram of an RF front-end circuit 30 according to the second preferred embodiment.

Note that elements (the antenna element 2, an RF signal processing circuit (RFIC) 3, and a baseband signal processing circuit (BBIC) 4) connected to the RF front-end circuit 30 are additionally illustrated in the diagram. The RF front-end circuit 30, the RF signal processing circuit 3, and the baseband signal processing circuit 4 define a communication apparatus 40.

The RF front-end circuit 30 includes the quadplexer 1 according to the first preferred embodiment, a reception-side switch 13, a transmission-side switch 23, a low-noise amplifier circuit 14, and a power amplifier circuit 24.

The reception-side switch 13 includes two selection terminals respectively connected to the individual terminals Port 11 and Port 21, which are reception terminals of the quadplexer 1, and a common terminal connected to the low-noise amplifier circuit 14.

The transmission-side switch 23 includes two selection terminals respectively connected to the individual terminals Port 12 and Port 22, which are transmission terminals of the quadplexer 1, and a common terminal connected to the power amplifier circuit 24.

The reception-side switch 13 and the transmission-side switch 23 each preferably include, for example, a SPDT (Single Pole Double Throw) type, which connects the common terminal and a signal path corresponding to a certain band in accordance with a control signal from a controller (not illustrated). Note that the number of signal paths connected to the common terminal is not restricted to one, and may be more than one. In other words, the RF front-end circuit 30 may be provided for carrier aggregation.

The low-noise amplifier circuit 14 is a reception amplifier circuit that amplifies an RF signal (here, an RF reception signal) having gone through the antenna element 2, the quadplexer 1, and the reception-side switch 13, and outputs the amplified signal to the RF signal processing circuit 3.

The power amplifier circuit 24 is a transmission amplifier circuit that amplifies an RF signal (here, an RF transmission signal) output from the RF signal processing circuit 3 and outputs the amplified signal to the antenna element 2 via the transmission-side switch 23 and the quadplexer 1.

The RF signal processing circuit 3 performs signal processing on an RF reception signal input from the antenna element 2 via a reception signal path by, for example, down-converting the RF reception signal, and outputs a reception signal generated by the signal processing to the baseband signal processing circuit 4. In addition, the RF signal processing circuit 3 performs signal processing on a transmission signal input from the baseband signal processing circuit 4 by, for example, up-converting the transmission signal, and outputs an RF transmission signal generated by the signal processing to the power amplifier circuit 24. The RF signal processing circuit 3 is preferably, for example, an RFIC.

A signal processed by the baseband signal processing circuit 4 is used as, for example, an image signal to display an image, or an audio signal for conversation.

Note that the RF front-end circuit 30 may include other circuit elements between the above-described elements.

According to the RF front-end circuit 30 and the communication apparatus 40 with the above-described configuration, ripples in the passband are able to be reduced or prevented by including the quadplexer 1 according to the first preferred embodiment.

Note that the RF front-end circuit 30 may include, instead of the quadplexer 1 according to the first preferred embodiment, a quadplexer according to the modification of the first preferred embodiment.

In addition, the communication apparatus 40 need not include the baseband signal processing circuit (BBIC) 4 depending on the RF signal processing method.

Although the multiplexers, the RF front-end circuits, and the communication apparatuses according to preferred embodiments of the present invention and modifications thereof have been described, the present invention includes other preferred embodiments achieved by combining arbitrary elements in the above-described preferred embodiments and modifications, modifications obtained by applying various changes conceivable to those skilled in the art to the above-described preferred embodiments without departing from the gist of the present invention, and various devices including the multiplexers, the RF front-end circuits, and the communication apparatuses according to preferred embodiments of the present invention and modifications thereto.

For example, although a quadplexer including two duplexers has been described above as a multiplexer by way of example, the present invention is applicable to, for example, a hexaplexer including three duplexers. In other words, the multiplexer only needs to include two or more duplexers.

In addition, it has been described in the above-described first preferred embodiment that the filter 12 corresponds to the first filter and the filter 22 corresponds to the second filter. In other words, the first and second filters are both transmission filters in the above-described first preferred embodiment. However, in the case in which a series resonator closest to the common terminal of the first filter includes one resonator, the present invention is not restricted by applications of the first and second filters, and is applicable to a multiplexer in which stopband ripples of the first filter are located in the passband of the second filter. Therefore, at least one of the first and second filters may be a reception filter.

In addition, a series resonator closest to the common terminal of the first filter is not restricted to a SAW resonator, and may be, for example, a BAW resonator.

In addition, the method of making the design parameters different has been described in the above-described first preferred embodiment as the method of making ripples of the impedance characteristics of the first split resonator and the second split resonator different. However, the method of making ripples of the impedance characteristics different is not restricted to the method of making the design parameters different, and may be achieved by, for example, making the external environment of the first and second split resonators different.

In addition, from the viewpoint of reducing or preventing ripples in the passband, the first and second split resonators (such as the split resonators 121sa and 121sb), it is preferable that the distance between the IDT electrodes 32a and 32b and each of the reflectors 32c is, for example, greater than or equal to about 0.44λ and less than about 0.5λ where λ is the wavelength of elastic waves defined by the electrode cycle of the IDT electrodes 32a and 32b. In other words, it is preferable that about $0.44 \leq \lambda_{ga} < $ about 0.5 be satisfied. That is, the inventor of preferred embodiments of the present invention discovered that, as a result of extensive study, ripples in the passband are able to be reduced or prevented in the case in which the distance between the IDT electrodes 32a and 32b and each of the reflectors 32c is greater than or equal to about 0.44λ and less than about 0.5λ. Specifically, if the distance between the IDT electrodes 32a and 32b and each of the reflectors 32c is made too small, ripples in the passband of the first filter increase. Alternatively, if the distance between the IDT electrodes 32a and 32b and each of the reflectors 32c is made too large, ripples in the passband of the second filter increase. Therefore, ripples in the passband are able to be reduced or prevented in both of the first and second filters by maintaining the distance between the IDT electrodes 32a and 32b and each of the reflectors 32c within an appropriate range.

Preferred embodiments of the present invention may be widely used as multiplexers, front-end circuits, and communication apparatuses applicable to a multiband system in communication devices, such as cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a common terminal;
   a first terminal and a second terminal;
   a first duplexer disposed on a first path connecting the common terminal and the first terminal; and
   a second duplexer disposed on a second path connecting the common terminal and the second terminal; wherein
   a first filter included in the first duplexer has a passband with frequencies lower than frequencies of a passband of a second filter included in the second duplexer;
   the first filter includes one or more series resonators disposed on the first path, and one or more parallel resonators disposed on a path connecting the first path and ground;
   a series resonator closest to the common terminal among the one or more series resonators includes a plurality of split resonators connected in series without any of the one or more parallel resonators connected therebetween;
   the plurality of split resonators are each an elastic wave resonator including an IDT electrode and a reflector; and include first and second split resonators with impedance characteristics having ripples different from each other in a certain frequency range; and
   the certain frequency range is a frequency range that is higher than an anti-resonant frequency of the series resonator closest to the common terminal, that is defined by a pitch of a plurality of electrode fingers included the reflector, and that is included in a passband of the second filter.

2. The multiplexer according to claim 1, wherein the plurality of split resonators include three or more split resonators in which the ripples are different from each other.

3. The multiplexer according to claim 1, wherein the first and second split resonators have at least one different design parameter such that the ripples are different from each other.

4. The multiplexer according to claim 3, wherein the first and second split resonators have the at least one different design parameter such that capacitances of the IDT electrodes are equal or approximately equal.

5. The multiplexer according to claim 3, wherein the at least one different design parameter is at least one of the pitch, a cross width, a number of pairs, and a duty of the plurality of electrode fingers included the IDT electrode, and a distance between the IDT electrode and the reflector.

6. The multiplexer according to claim 1, wherein the first and second split resonators are disposed such that a distance between the IDT electrode and the reflector is greater than or equal to about 0.44λ and less than about 0.5λ where λ is the pitch of the plurality of electrode fingers included in the IDT electrode.

7. The multiplexer according to claim 1, wherein the first filter has a ladder filter structure that includes at least one stage including the one or more series resonators and the one or more parallel resonators.

8. The multiplexer according to claim 7, wherein the first filter has a filter structure that includes a plurality of stages.

9. The multiplexer according to claim 1, wherein the first filter further includes a longitudinally-coupled filter structure disposed on the first path.

10. The multiplexer according to claim 1, further comprising:
a piezoelectric film including a main surface on which the IDT electrode and the reflector are disposed;
a high-acoustic-velocity supporting substrate in which an acoustic velocity of bulk waves propagating therethrough is higher than an acoustic velocity of elastic waves propagating through the piezoelectric film; and
a low-acoustic-velocity film disposed between the high-acoustic-velocity supporting substrate and the piezoelectric film, in which an acoustic velocity of bulk waves propagating therethrough is lower than the acoustic velocity of bulk waves propagating through the piezoelectric film.

11. The multiplexer according to claim 1, wherein
the passband of the first filter is an uplink frequency band of Band 3; and
the passband of the second filter is an uplink frequency band of Band 1.

12. A radio-frequency front-end circuit comprising:
the multiplexer according to claim 1; and
an amplifier circuit connected to the multiplexer.

13. The radio-frequency front-end circuit according to claim 12, wherein the plurality of split resonators include three or more split resonators in which the ripples are different from each other.

14. The radio-frequency front-end circuit according to claim 12, wherein the first and second split resonators have at least one different design parameter such that the ripples are different from each other.

15. The radio-frequency front-end circuit according to claim 14, wherein the first and second split resonators have the at least one different design parameter such that capacitances of the IDT electrodes are equal or approximately equal.

16. The radio-frequency front-end circuit according to claim 14, wherein the at least one different design parameter is at least one of the pitch, a cross width, a number of pairs, and a duty of the plurality of electrode fingers included the IDT electrode, and a distance between the IDT electrode and the reflector.

17. The radio-frequency front-end circuit according to claim 12, wherein the first and second split resonators are disposed such that a distance between the IDT electrode and the reflector is greater than or equal to about 0.44λ and less than about 0.5λ where λ is the pitch of the plurality of electrode fingers included in the IDT electrode.

18. The radio-frequency front-end circuit according to claim 12, wherein the first filter has a ladder filter structure that includes at least one stage including the one or more series resonators and the one or more parallel resonators.

19. The radio-frequency front-end circuit according to claim 18, wherein the first filter has a filter structure that includes a plurality of stages.

20. A communication apparatus comprising:
an RF signal processing circuit that processes a radio frequency signal transmitted and received by an antenna element; and
the radio-frequency front-end circuit according to claim 12 that transfers the radio frequency signal between the antenna element and the RF signal processing circuit.

* * * * *